(12) United States Patent
Maier et al.

(10) Patent No.: US 10,514,397 B2
(45) Date of Patent: Dec. 24, 2019

(54) SELF-POWERED MEASURING APPARATUS AND MEASUREMENT METHOD

(71) Applicant: SIEMENS AKTIENGESELLSCHAFT, München (DE)

(72) Inventors: Martin Maier, Erbendorf (DE); Uwe Weiss, Amberg (DE)

(73) Assignee: Siemens Aktiengesellschaft, München (DE)

( * ) Notice: Subject to any disclaimer, the term of this patent is extended or adjusted under 35 U.S.C. 154(b) by 17 days.

(21) Appl. No.: 15/753,256

(22) PCT Filed: Jul. 7, 2016

(86) PCT No.: PCT/EP2016/066120
§ 371 (c)(1),
(2) Date: Feb. 16, 2018

(87) PCT Pub. No.: WO2017/029025
PCT Pub. Date: Feb. 23, 2017

(65) Prior Publication Data
US 2018/0299492 A1 Oct. 18, 2018

(30) Foreign Application Priority Data
Aug. 19, 2015 (DE) .................. 10 2015 215 801

(51) Int. Cl.
*G01R 15/18* (2006.01)
*G01R 15/04* (2006.01)
(Continued)

(52) U.S. Cl.
CPC ............. *G01R 15/18* (2013.01); *G01R 15/04* (2013.01); *G01R 15/08* (2013.01); *G01R 19/257* (2013.01)

(58) Field of Classification Search
CPC ........ G01R 15/18; G01R 15/04; G01R 15/08; G01R 19/257
(Continued)

(56) References Cited

U.S. PATENT DOCUMENTS 3,912,976 A * 10/1975 Sons ................. H02H 3/093
361/31
4,441,066 A * 4/1984 Burmenko ............. H02J 7/027
320/165
(Continued)

FOREIGN PATENT DOCUMENTS

DE 3710291 A1 10/1988
DE 102008012545 A1 9/2009
(Continued)

OTHER PUBLICATIONS

Kocamiş, Ali Eren. Reactive power compensation in distribution system. Diss. DEÜ Fen Bilimleri Enstitüsü, 2009. (Year: 2009).*
(Continued)

*Primary Examiner* — Christopher P McAndrew
(74) *Attorney, Agent, or Firm* — Lempia Summerfield Katz LLC

(57) ABSTRACT

The present embodiments relate to a measuring apparatus and an associated measurement method. The measuring apparatus is installed on a line and includes a sensing unit having a first and a second voltage divider for producing a first and a second measurement signal with a measurement transducer. The first and second measurement signals are each forwardable via a measurement line directly to a signal transducer. The signal transducer is supplied with power via a supply line by being switchably connected to the measurement transducer.

16 Claims, 2 Drawing Sheets

(51) Int. Cl.
*G01R 15/08* (2006.01)
*G01R 19/257* (2006.01)

(58) Field of Classification Search
USPC .......................................................... 324/127
See application file for complete search history.

(56) References Cited

U.S. PATENT DOCUMENTS

| | | | | |
|---|---|---|---|---|
| 4,896,106 A * | 1/1990 | Voisine | ................ | G01R 21/127 324/107 |
| 4,901,195 A * | 2/1990 | Stemporzewski, Jr. | ................... | B67D 7/3236 340/649 |
| 4,998,061 A * | 3/1991 | Voisine | ................ | G01R 21/127 324/105 |
| 5,264,786 A * | 11/1993 | Clarke | ................... | G01R 15/04 324/142 |
| 5,283,708 A * | 2/1994 | Waltz | ................... | H02H 1/066 361/103 |
| 5,537,024 A * | 7/1996 | Lang | ................ | G01R 19/16542 320/DIG. 21 |
| 5,760,587 A * | 6/1998 | Harvey | ................ | G01R 31/007 320/106 |
| 5,859,529 A * | 1/1999 | Baumgartl | ............. | G01R 15/06 323/361 |
| 5,875,103 A * | 2/1999 | Bhagwat | ............. | H02M 3/3376 363/17 |
| 6,304,088 B1 * | 10/2001 | Yee | ........................ | G01R 15/04 324/433 |
| 10,164,513 B1 * | 12/2018 | Lin | ........................ | H02M 3/156 |
| 2003/0080812 A1 * | 5/2003 | Allinger | ................ | G01R 15/04 330/69 |
| 2004/0061489 A1 * | 4/2004 | Ramirez | ............ | G01R 19/2513 324/117 R |
| 2005/0057260 A1 * | 3/2005 | Lindley | ................... | G01R 15/04 324/522 |
| 2008/0001575 A1 * | 1/2008 | Bonin | .............. | G01R 19/16542 320/136 |
| 2008/0192515 A1 * | 8/2008 | Huynh | .............. | H02M 3/33507 363/21.12 |
| 2012/0062249 A1 | 3/2012 | Shamir | | |
| 2012/0198908 A1 * | 8/2012 | Warneck | ............... | G01D 18/008 73/1.01 |
| 2015/0015235 A1 | 1/2015 | Brendel | | |

FOREIGN PATENT DOCUMENTS

| | | |
|---|---|---|
| DE | 102013213566 A1 | 1/2015 |
| EP | 2824464 A1 | 1/2015 |
| WO | WO02065142 A1 | 8/2002 |

OTHER PUBLICATIONS

German Office Action for related German Application No. 10 2015 215 801.2 dated Mar. 18, 2016.
PCT International Search Report and Written Opinion of the International Searching Authority dated Sep. 27, 2016 for corresponding PCT/EP2016/066120.

* cited by examiner

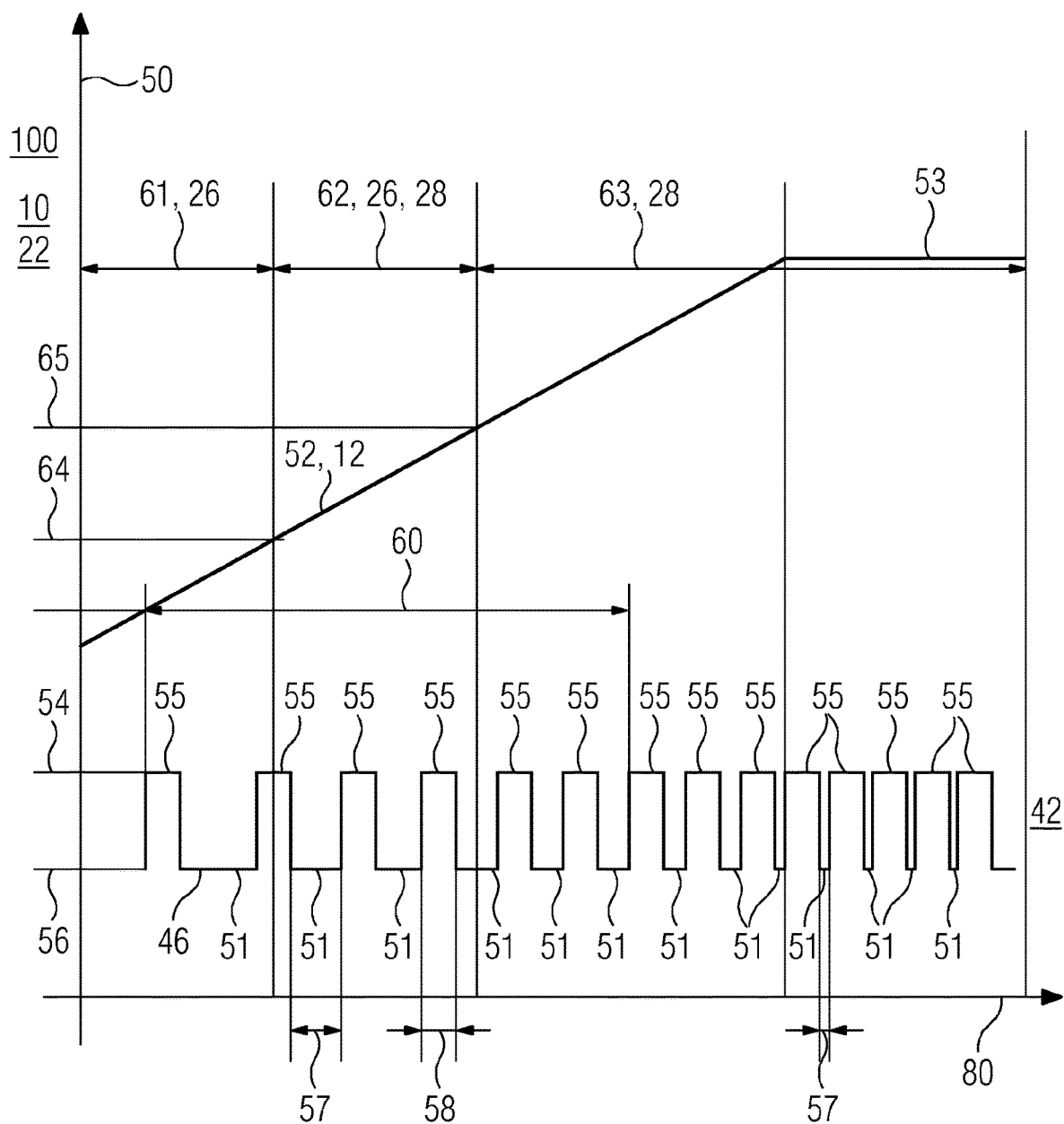

SELF-POWERED MEASURING APPARATUS AND MEASUREMENT METHOD

CROSS-REFERENCE TO RELATED APPLICATIONS

This application is the National Stage of International Application No. PCT/EP2016/066120, filed Jul. 7, 2016, which claims the benefit of German Patent Application No. DE 102015215801.2, filed Aug. 19, 2015. The entire contents of these documents are hereby incorporated herein by reference.

TECHNICAL FIELD

The present embodiments relate to an internally powered measuring device for determining a current intensity on a line and to an associated measurement method.

BACKGROUND

DE 37 10 291 A1 discloses a circuit for analog-to-digital conversion of signals of different levels, the circuit arranged with a plurality of voltage dividers. Signals are generated via the voltage dividers and are supplied to comparators connected to a flash converter. An input signal and a reference voltage are applied across the comparators.

DE 10 2008 012 545 A1 discloses a circuit for comparing voltages, the circuit arranged with a plurality of voltage dividers connected to a voltage source. The voltage dividers are each connected to an input of an operational amplifier that is connected to a supply voltage.

A disadvantage of known devices for determining the current intensity on a line is that only above a certain minimum current intensity do the known devices allow an internal electrical supply to a device over the line undergoing determination without considerably reducing the accuracy of measurement. For the purpose of broadening the measurement range, operational amplifiers are frequently used. The operational amplifiers are complex and costly, and require considerable voltage to be supplied. There is a need for a measuring device that allows precise measurement in a broader measurement range with a low complexity, that may be manufactured economically and that overcomes the disadvantages of the prior art.

SUMMARY AND DESCRIPTION

The scope of the present invention is defined solely by the appended claims and is not affected to any degree by the statements within this summary.

One or more of the present embodiments may obviate one or more of the drawbacks or limitations in the related art. For example, a measuring device is provided that may be connected to a line for the purpose of determining a current intensity. The measuring device has a determining unit arranged with a first and a second voltage divider. The voltage dividers are coupled to a primary measurement signal generated by a measuring transformer cooperating with the line. The primary measurement signal is suitable for determining and quantifying the current intensity on the line. Each of the voltage dividers is suitable for generating a measurement signal output over a respective measurement line. The first measurement signal from the first voltage divider is passed, over the associated measurement line, to a first signal input of a signal converter in an evaluation unit. Similarly, the second measurement signal from the second voltage divider is passed, over the associated measurement line, to a second signal input of the signal converter in the evaluation unit. The signal converter is suitable for evaluating the first and the second measurement signals separately or in combination, for the purpose of forming a measured value. For example, combining the first and the second measurement signals may add the two measurement signals. For the purpose of supplying current to the signal converter, the signal converter is connected to the measuring transformer by way of a supply line. Here, the supply line may be switched, such that the current supply to the signal converter may be deliberately interrupted.

In the measuring device, the current supply to the signal converter may be activated and deactivated for adjustable lengths of time. The voltage dividers used have the effect of producing different scaling levels for the measurement signals and allow complex and costly components (e.g., operational amplifiers) to be dispensed with. In the event of a small current intensity on the line, the signal converter may be deactivated, with resulting in the energy supply to the measuring circuit to be maintained. The internal electrical supply of the measuring device through the measuring transformer further allows additional current sources to be dispensed with, resulting the measuring device to be of low complexity.

In an embodiment, the signal converter is an analog-to-digital converter. For example, the analog-to-digital converter may have a measurement resolution of 8 to 12 bits (e.g., 10 bits). An analog-to-digital converter is suitable for processing incoming measurement signals quickly and reliably, and may be manufactured at low cost. The present embodiments may further allow analog-to-digital converters to be used with a reduced measurement resolution. As a result, the achievable amount of current saved by the analog-to-digital converter (e.g., and the economic nature thereof) are further increased.

In an embodiment, a switch element is provided in the measuring device for switching the power supply to the signal converter, and a switch element is provided for providing a reference voltage. The reference voltage may provide a positive potential, resulting in no negatively charged portions in the first and the second measurement signal. Consequently, evaluation of the first and the second measurement signal may be made simpler. The switch elements are connected to one another by an adjustable coupling, resulting in that the actuation of one switch element follows the other switch element. The coupling between the switch elements is adjustable such that it is possible to select a delay by which actuation of the one switch element follows that of the other switch element. In an embodiment, the delay is between 0 ms and 20 ms.

Actuation of at least one of the switch elements in the measuring device may be triggered by a clock generator. The clock generator is suitable for outputting a switch signal at an adjustable frequency, opening or closing the triggered switch element, and with the other switch element following the triggered switch element. Providing the power supply to the signal converter and the reference voltage in a clocked manner allows for adjusting the proportion of time during which there are active phases (e.g., with measurements) and inactive phases (e.g., with no measurements), while the measuring device is in continuous operation (e.g., in relation to a desired power consumption or desired accuracy of measurement). As a result, the measuring device may be adapted to a broad spectrum of operating conditions using simple parameters.

In another embodiment, the clock generator is connected separately to the switch element for providing the reference voltage. The clock generator is also connected to the switch element in the supply line of the signal converter. The clock generator is suitable for actuating the two switching devices by separate switching commands. Consequently, coupling between the switch elements is made by the arrangement of the clock generator. An adjustable delay is provided between the communicating switch signals on the two switch elements. For example, the delay may be between 0 ms and 20 ms.

In an embodiment, the first voltage divider of the measuring device may be suitable for generating the first measurement signal. The first measurement signal may be suitable for determining a first value range of the current intensity on the line. At the same time, the second voltage divider may be suitable for generating the second measurement signal. The second measurement signal may be suitable for determining a second value range of the current intensity on the line. For example, the two value ranges may have a reduced region of overlap. Consequently, a greater measurement range may be covered by the two voltage dividers overall (e.g., substantially including the two value ranges together). The signal converter may be suitable for identifying the more precise measurement signal for the prevailing value range of the current intensity, such that precise measurement may always be possible. Accordingly, this embodiment overcomes the disadvantage of an individual voltage divider that only supplies exact measurement signals for a predetermined value range.

In an embodiment, at least one third voltage divider may be provided in the determining unit of the measuring device. The third voltage divider is suitable for generating a third measurement signal. With an appropriate configuration of all the voltage dividers, a third voltage divider allows the measurement signals to be scaled for a broad value range of the existing current intensity. Consequently, the signal converter may always be provided with a measurement signal that is precise for the existing current intensity, and the dynamic range of the claimed measuring device may be increased overall. A corresponding further increase in the number of voltage dividers used may allow the advantages over the prior art to be further developed, depending on the requirement of the respective application case.

In another embodiment, at least one of the voltage dividers includes two resistors connected in series. Selection of resistors allows the desired value range to be established in a simple manner when the current intensity is measured. Resistors may be manufactured economically in a broad range of configurations and may provide a high degree of robustness.

In a further embodiment, a method is provided for measuring the current intensity on a line. The method includes an act of generating a primary measurement signal using a measuring transformer that interacts directly with the line to be monitored. For example, the primary measurement signal is an electrical current generated on the line by induction. In a further act, the primary measurement signal is fed to a first and a second voltage divider and processed to give a first and a second measurement signal, respectively. In a subsequent act, the first and the second measurement signal are passed directly, over measurement lines, to a signal converter. As a result of the signal converter, at least one of the measurement signals is evaluated, such that a measured value is determined for the current intensity on the line. Power is supplied to the signal converter directly through the measuring transformer. The supply line provided for supplying power between the measuring transformer and the signal converter may be switched (e.g., interrupted by a switch element) deliberately and in a controlled manner.

As a result of evaluating one or more measurement signals, the method allows for exact measurement of the current intensity on the line. The fact that the power supply to the signal converter may be switched on and off allows the power consumption during the measurement method to be reduced (e.g., inasmuch as the signal converter may be switched off purposefully at times when no measurement is required or provided). As a result, the method may be performed with an energy savings. Deactivating the signal converter also enables the energy supply to the measuring circuit to be maintained.

In an embodiment, the first and the second measurement signal are detected and evaluated by a signal converter configured as an analog-to-digital converter. An analog-to-digital converter is suitable for evaluating measurement signals quickly and reliably, and reduces complexity. Further, an analog-to-digital converter may be manufactured at low cost.

In another embodiment, a switch element that enables the power supply to the signal converter to be switched on and off is actuated by a clock generator having an adjustable switch signal. Actuation includes opening and closing the switch element. Actuation of the switch element in the supply line to the signal converter may also to be performed such that the clock generator actuates, by a switch signal, a switch element that is used to supply at least one of the voltage dividers with a reference voltage. The switch element used to provide the reference voltage is connected by an adjustable coupling to the switch element in the supply line to the signal converter, resulting in signal converter switch element activation following the actuation of the switch element providing the reference voltage.

The switch signal of the clock generator is adjustable such that both the duration of active phases (e.g., during which the actuated switch element is closed) and the duration of inactive phases (e.g., during which the actuated switch element is open) may be selected by a program or a user input. Consequently, the switch signal and/or a sequence of switch signals may be adjusted as desired. This makes it possible to deactivate the signal converter in operating conditions in which exact measurement of the current intensity on the line is not required or provided. The energy supply (e.g. the internal power of the measurement electronics) may be adapted to the existing current intensity. Further, the scanning frequency may be configured during operation, depending on requirements.

In an embodiment of the method, the switch signal for the switch element is output to the supply line at substantially the same time as actuation of a switch element used to supply at least one of the voltage dividers with a reference voltage. The reference voltage may provide a positive potential, resulting in that there are no negatively charged portions in the first and the second measurement signal. This simplifies evaluation of the first and the second measurement signal. Thus, a precisely evaluable first and/or second measurement signal are generated substantially instantaneously.

Further, the method may be performed as a sequence of inactive phases and active phases. During the active phases, the reference voltage and the power supply to the signal converter are activated, and measured values are generated. During the inactive phases, at least the power supply to the signal converter is deactivated. For example, the higher the current intensity on the line, the shorter the duration of the inactive phases. Consequently, when there is a high current intensity on the line, there is a high measurement frequency or scanning frequency, such the higher number of measurement signals increases the accuracy of measurement. At the same time, current consumption by the signal converter is increased. The higher current consumption of the signal converter is compensated as a result of the higher current intensity. In the event of a reduced current intensity, measurement signals of higher accuracy are present because scanning continues over a longer period, such that scanning at reduced frequency gives a sufficiently precise measured value. Consequently, there is reduced current consumption by the signal converter.

In an embodiment, within an operating interval, the ratio of the duration of inactive phases to the duration of active phases is between zero and ten. With a ratio of zero, there is thus a continuous measuring operation, whereas with a ratio of ten, the inactive phases last for ten times as long as the active phase during which measured values are generated. This spread enables adjustment to a broad range of current intensities on the line. The method may be adjusted to a large number of possible uses.

In a further embodiment, when the measured value is generated, only the first measurement signal may be used if the current intensity on the line is below a first threshold value. In the case of a current intensity between the first and a second threshold value, the first and the second measurement signal may be used. The measurement signals are scaled to different extents by the different forms taken by the two voltage dividers, and produce an optimized basis for determining the measured value by the signal converter, for different value ranges of the current intensity.

BRIEF DESCRIPTION OF THE DRAWINGS

FIG. 2 shows a time graph of an embodiment of the measurement method.

DETAILED DESCRIPTION

Figure 1:
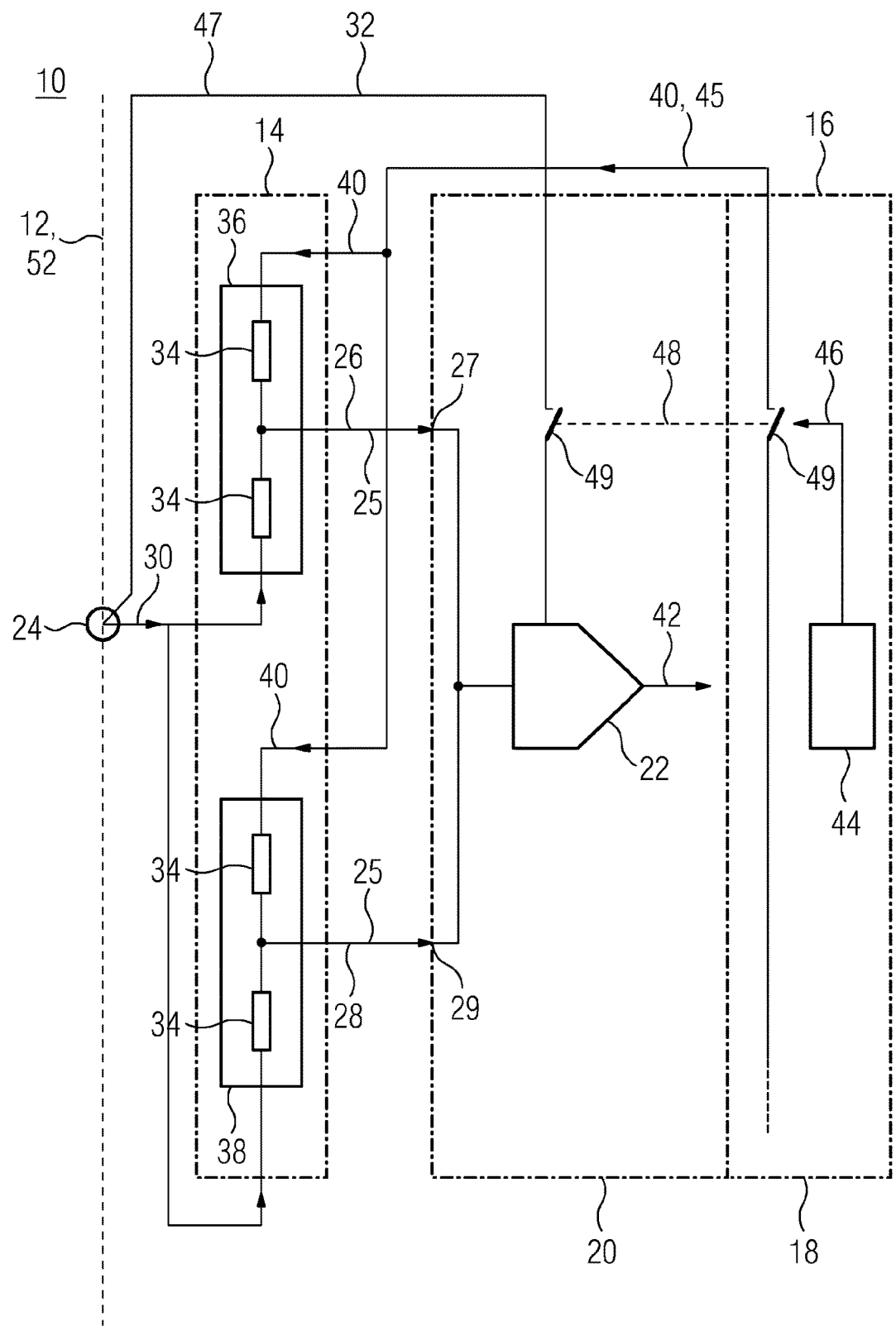
FIG. 1 shows a layout of an embodiment of the measuring device.

FIG. 1 schematically illustrates the layout of an embodiment of the measuring device 10 connected to a line 12 in which the existing current intensity 52 is to be measured. The connection between the line 12 and the measuring device 10 may be provided by a measuring transformer 24 that provides a primary measurement signal 30. Furthermore, the measuring transformer 24 induces a supply current 47 that is passed over a supply line 32. The primary measurement signal 30 is fed from the measuring transformer 24 to a determining device 14 of the measuring device 10, and the primary measurement signal 30 is supplied to a first and a second voltage divider 36, 38. Each of the voltage dividers 36, 38 includes two resistors 34 that are connected in series. A measurement line 25 runs from each of the voltage dividers 36, 38 directly to a processing unit 16 of the measuring device 10. With this arrangement, the measurement lines 25 each branch at a point between the resistors 34 of the voltage dividers 36, 38. The processing unit 16 includes an evaluation unit 20 that is provided with a signal converter 22. A first measurement signal 26 is fed over the measurement line 25, from the first voltage divider 36 directly to a first signal input 27 of the signal converter 22. Further, a second measurement signal 28 is fed over the measurement line 25, from the second voltage divider 38 directly to a second signal input 29 of the signal converter 22.

Depending on the level of the current intensity 52 on the line 12, evaluation of the first and/or second measurement signal 26, 28 is performed to give a measured value 42. Continuous evaluation of the measured signals 26, 28 is performed in the measuring device 10 in a clocked manner. The processing unit 16 of the measuring device 10 additionally includes a control unit 18 provided with a clock generator 44. Furthermore, a conductor 45 provides the voltage dividers 36, 38 with a reference voltage 40 to which the first and second measurement signals 26, 28 are related. The conductor 45 is provided with a switch element 49 by which the conductor 45 may be interrupted. Actuation of the switch element 49 on the conductor 45 is performed by switch signals 46 that are output by the clock generator 44. The switch element 49 on the conductor 45 is connected by a coupling 48 to the further switch element 49 arranged on the supply line 32. As a result of the coupling 48, the switch element 49 on the supply line 32 follows actuation of the switch element 49 on the conductor 45. The coupling 48 converts the actuation of the switch element 49 on the conductor 45 into actuation of the switch element 49 on the supply line 49 with substantially no delay. When the switch elements 49 are closed, the reference voltage 40 (e.g. the reference potential for the first and the second measurement signal 26, 28) is applied across the voltage dividers 36, 38, resulting in that the measurement signals 26, 28 represent the current intensity 52 existing on the line 12. At the same time, the signal converter 22 is supplied with current and is able to evaluate the measurement signals 26, 28 individually or in combination to give the measured value 42.

FIG. 2 shows a time graph of an embodiment of the method 100. Here, the horizontal axis forms the axis 80 of time and the vertical axis forms the axis 50 of magnitude. A current of increasing current intensity 52 (e.g., which exists on a line 12 that is not illustrated in more detail) is represented. The current intensity 52 increases to a threshold value 53 and remains constant there. FIG. 2 further shows a representation of the switch signal 46 that is used to perform the method 100. The switch signal 46 is substantially a series of square signals that move between an active threshold 54 and an inactive threshold 56. During an active phase 55, there is a power supply to a signal converter 22 of a measuring device 10 (e.g., not illustrated in more detail) and a measured value 42 (e.g., not illustrated in more detail) is determined. Both the active phases 55 and the inactive phases 51 have durations 57, 58 that are adjustable. In FIG. 2, the duration 57 of the inactive phases 51 lessens as the current intensity 52 increases. Consequently, there is an approximately continuous measuring operation in the region of the threshold value 53 of the current intensity 52, interrupted by only minimal inactive phases 51. In the reference interval 60, there is an increasing ratio of the durations 57 of the inactive phases 51 to the durations 58 of the active phases 55.

Further, if the measured value 42 (e.g., not illustrated in more detail) is determined below a first threshold value 64, the measured value 42 is only determined based on the first measurement signal 26. Succeeding the measurement range 61 below the first threshold value 64 is a second measurement range 62 that lies between the first and the second threshold value 64, 65. In the second measurement range 62, the measured value 42 is determined by the first and the second measurement signal 26, 28 in combination. Succeeding the second measurement range 62 is a third measurement range 63 in which the current intensity 52 in the conductor 12 is above the second threshold value 65. In the third measurement range 63, the measured value 42 is determined only based on the second measurement signal 28. As the current intensity 52 increases, the duration 57 of the inactive phases 51 falls. The increasing current intensity 52 improves the power supply to the signal converter, but precise measurement of the current intensity 52 requires a greater number of measurement iterations. This is achieved by the reduction in the duration 57 of the inactive phases 51.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A measuring device for determining a current intensity on a line, the measuring device comprising:
   a measuring transformer;
   a signal converter; and
   a determining unit having a first voltage divider and a second voltage divider configured to generate a first measurement signal and a second measurement signal, respectively, from a primary measurement signal provided by the measuring transformer,
   wherein the first voltage divider is configured to determine the current intensity on the line within a first value range, and, at a same time, the second voltage divider is configured to determine the current intensity on the line within a second, different value range,
   wherein the first measurement signal and the second measurement signal are configured to be passed directly, over a measurement line, to the signal converter,
   wherein the signal converter is configured to identify a more precise measurement signal for a prevailing value range of the current intensity,
   wherein, for supplying current to the signal converter, the signal converter is switchably connected to the measuring transformer by a supply line.

2. The measuring device of claim 1, wherein the signal converter is an analog-to-digital converter.

3. The measuring device of claim 1, further comprising:
   a first switch element configured to actuate a switchable power supply to the signal converter; and
   a second switch element configured to provide a reference voltage to at least one of the first voltage divider and the second voltage divider,
   wherein the first switch element is connected to the second switch element by an adjustable coupling.

4. The measuring device of claim 3, further comprising:
   a clock generator configured to actuate at least one of the first or second switch elements.

5. The measuring device of claim 3, wherein, with the adjustable coupling, a duration of a delay between a switch signal of a clock generator and the actuation of the first switch element is adjustable.

6. The measuring device of claim 1, wherein the determining unit further comprises a third voltage divider configured to generate a third measurement signal.

7. The measuring device of claim 1, wherein at least one of the first or second voltage dividers comprises two resistors connected in series.

8. A method for measuring a current intensity on a line, the method comprising:
   generating a primary measurement signal using a measuring transformer;
   generating a first measurement signal and a second measurement signal by processing the primary measurement signal by a first voltage divider and a second voltage divider, respectively;
   determining the current intensity on the line within a first value range using the first voltage divider, and determining, at a same time, the current intensity on the line within a second, different value range using the second voltage divider; and
   determining and evaluating the first measurement signal, the second measurement signal, or the first and the second measurement signals to generate a measured value using a signal converter, wherein the signal converter is configured to identify a more precise measurement signal for a prevailing value range of the current intensity,
   wherein power is switchably supplied to the signal converter through the measuring transformer.

9. The method of claim 8, wherein the signal converter is an analog-to-digital converter.

10. The method of claim 8, further comprising:
    actuating a first switch element in a supply line to the signal converter by a clock generator having an adjustable clock signal.

11. The method of claim 10, wherein the clock signal is output at a same time as an actuation of a second switch element configured to supply at least one of the first or second voltage dividers with a reference voltage.

12. The method of claim 10, wherein the higher the current intensity on the line, the shorter a duration of inactive phases between active phases of the power supply to the signal converter.

13. The method of claim 12, wherein, within an operating interval, a ratio of the duration of inactive phases to a duration of active phases is between zero and ten.

14. A method for measuring a current intensity on a line, the method comprising:
    generating a primary measurement signal using a measuring transformer;
    generating a first measurement signal and a second measurement signal by processing the primary measurement signal by a first voltage divider and a second voltage divider, respectively, and
    evaluating only the first measurement signal when the current intensity is below a first threshold value, evaluating both the first and the second measurement signals when the current intensity is between the first threshold value and a second threshold value, and evaluating only the second measurement signal when the current intensity is above the second threshold value, and
    wherein power is switchably supplied to the signal converter through the measuring transformer.

15. The measuring device of claim 1, wherein the signal converter is immediately and directly switchably connected to the measuring transformer.

16. The measuring device of claim 5, wherein the duration of the delay is adjustable to a value between 0 ms and 20 ms.

* * * * *